United States Patent
Wang et al.

(10) Patent No.: US 11,817,172 B2
(45) Date of Patent: Nov. 14, 2023

(54) TABLE MANAGEMENT METHOD, MEMORY STORAGE DEVICE AND MEMORY CONTROL CIRCUIT UNIT

(71) Applicant: Hefei Core Storage Electronic Limited, Anhui (CN)

(72) Inventors: Chih-Ling Wang, Anhui (CN); Qi-Ao Zhu, Anhui (CN); Jing Zhang, Anhui (CN); Yang Zhang, Anhui (CN)

(73) Assignee: Hefei Core Storage Electronic Limited, Anhui (CN)

( * ) Notice: Subject to any disclaimer, the term of this patent is extended or adjusted under 35 U.S.C. 154(b) by 0 days.

(21) Appl. No.: 17/732,532

(22) Filed: Apr. 29, 2022

(65) Prior Publication Data

US 2023/0326502 A1    Oct. 12, 2023

(30) Foreign Application Priority Data

Apr. 7, 2022 (CN) .......................... 202210361467.3

(51) Int. Cl.
G11C 7/20 (2006.01)
G11C 7/10 (2006.01)
G11C 7/04 (2006.01)

(52) U.S. Cl.
CPC ................. G11C 7/20 (2013.01); G11C 7/04 (2013.01); G11C 7/1039 (2013.01); G11C 7/1069 (2013.01); G11C 7/1096 (2013.01)

(58) Field of Classification Search
CPC ........... G11C 7/20; G11C 7/04; G11C 7/1039; G11C 7/1069
See application file for complete search history.

(56) References Cited

U.S. PATENT DOCUMENTS

| 2016/0027524 A1* | 1/2016 | Park ..................... G11C 11/5642 |
| | | 365/185.18 |
| 2016/0110014 A1* | 4/2016 | Aono ..................... G06F 3/0488 |
| | | 345/173 |
| 2019/0088336 A1* | 3/2019 | Lin ........................ G11C 16/08 |
| 2019/0354314 A1* | 11/2019 | Hung ..................... G06F 3/0679 |
| 2021/0043261 A1 | 2/2021 | Yu et al. |
| 2021/0064277 A1 | 3/2021 | Lang et al. |

FOREIGN PATENT DOCUMENTS

| TW | 201947404 | 12/2019 |
| TW | 202205081 | 2/2022 |

OTHER PUBLICATIONS

"Office Action of Taiwan Counterpart Application", dated Oct. 5, 2022, p. 1-p. 8.

* cited by examiner

Primary Examiner — Han Yang
(74) Attorney, Agent, or Firm — JCIPRNET

(57) ABSTRACT

A table management method, a memory storage device and a memory control circuit unit are disclosed. The method includes: storing multiple table groups, wherein each of the table groups includes multiple voltage management tables; detecting a status of the memory storage device; determining one of the table groups as a target table group according to the status of the memory storage device, wherein the target table group includes multiple target voltage management tables; reading data from a rewritable non-volatile memory module by using at least one read voltage level according to at least one of the target voltage management tables.

24 Claims, 8 Drawing Sheets

TABLE MANAGEMENT METHOD, MEMORY STORAGE DEVICE AND MEMORY CONTROL CIRCUIT UNIT

CROSS-REFERENCE TO RELATED APPLICATION

This application claims the priority benefit of China application serial no. 202210361467.3, filed on Apr. 7, 2022. The entirety of the above-mentioned patent application is hereby incorporated by reference herein and made a part of this specification.

BACKGROUND

Technical Field

The disclosure relates to a memory management technique, and in particular relates to a table management method, a memory storage device, and a memory control circuit unit.

Description of Related Art

As smartphones, tablets, and notebook computers have grown rapidly in recent years, the demand of the consumers for storage media has also increased rapidly. Since a rewritable non-volatile memory module (e.g. a flash memory) has the characteristics of data non-volatility, power saving, small size, and having no mechanical structure, it is very suitable for being built in a variety of portable multimedia devices as exemplified above.

Generally, data is encoded before being stored in a rewritable non-volatile memory module. When data is to be read, the reading data may be decoded to attempt to correct errors therein. In addition, the setting of the read voltage level for the reading data also has a great influence on the accuracy of the reading data. Generally, multiple management tables may be stored in the rewritable non-volatile memory module. When data is to be read, the management tables may be queried according to a preset order, to determine the read voltage level used for the present reading according to the information in the management table that is ordered first from the management tables. If the data read using this read voltage level cannot be decoded correctly, the information in the next management table after this management table may be queried to determine the read voltage level used for the next reading. However, when the operating environment changes, using the preset management table to perform data reading may result in a decrease in data decoding efficiency.

SUMMARY

In view of this, the disclosure provides a table management method, a memory storage device, and a memory control circuit unit, which may improve or maintain data decoding efficiency in various statuses of the memory storage device.

An exemplary embodiment of the disclosure provides a table management method for a memory storage device. The memory storage device includes a rewritable non-volatile memory module. The table management method includes the following steps. Multiple table groups are stored, in which each of the table groups in the table groups includes multiple voltage management tables. A status of the memory storage device is detected. One of the table groups is determined as a target table group according to the status of the memory storage device, in which the target table group includes multiple target voltage management tables. Data is read from the rewritable non-volatile memory module using at least one read voltage level according to at least one of the target voltage management tables.

An exemplary embodiment of the disclosure further provides a memory storage device, which includes a connection interface unit, a rewritable non-volatile memory module, and a memory control circuit unit. The connection interface unit is configured to be coupled to the host system. The memory control circuit unit is coupled to the connection interface unit and the rewritable non-volatile memory module. The memory control circuit unit is configured for the following operations. Multiple table groups are stored, in which each of the table groups in the table groups includes multiple voltage management tables. A status of the memory storage device is detected. One of the table groups is determined as a target table group according to the status of the memory storage device, in which the target table group includes multiple target voltage management tables. Data is read from the rewritable non-volatile memory module using at least one read voltage level according to at least one of the target voltage management tables.

An exemplary embodiment of the disclosure further provides a memory control circuit unit, which includes a host interface, a memory interface, and a memory management circuit. The host interface is configured to be coupled to the host system. The memory interface is configured to be coupled to a rewritable non-volatile memory module. The memory management circuit is coupled to the host interface and the memory interface. The memory management circuit is configured for the following operations. Multiple table groups are stored, in which each of the table groups in the table groups includes multiple voltage management tables. A status of the memory control circuit unit is detected. One of the table groups is determined as a target table group according to the status of the memory control circuit unit, in which the target table group includes multiple target voltage management tables. Data is read from the rewritable non-volatile memory module using at least one read voltage level according to at least one of the target voltage management tables.

Based on the above, the table groups may be stored in advance, in which each of the table groups may include multiple voltage management tables. According to the status of the memory storage device, one of the table groups may be determined as a target table group, and the target table group may include multiple target voltage management tables. Thereafter, data may be read from the rewritable non-volatile memory module using at least one read voltage level according to at least one of the target voltage management tables. Thereby, the data decoding efficiency may be improved or maintained in various statuses of the memory storage device.

DETAILED DESCRIPTION OF DISCLOSED EMBODIMENTS

In general, a memory storage device (also referred to as a memory storage system) includes a rewritable non-volatile memory module and a controller (also referred to as a control circuit). The memory storage device may be used with a host system so that the host system may write data to or read data from the memory storage device.

Figure 1:
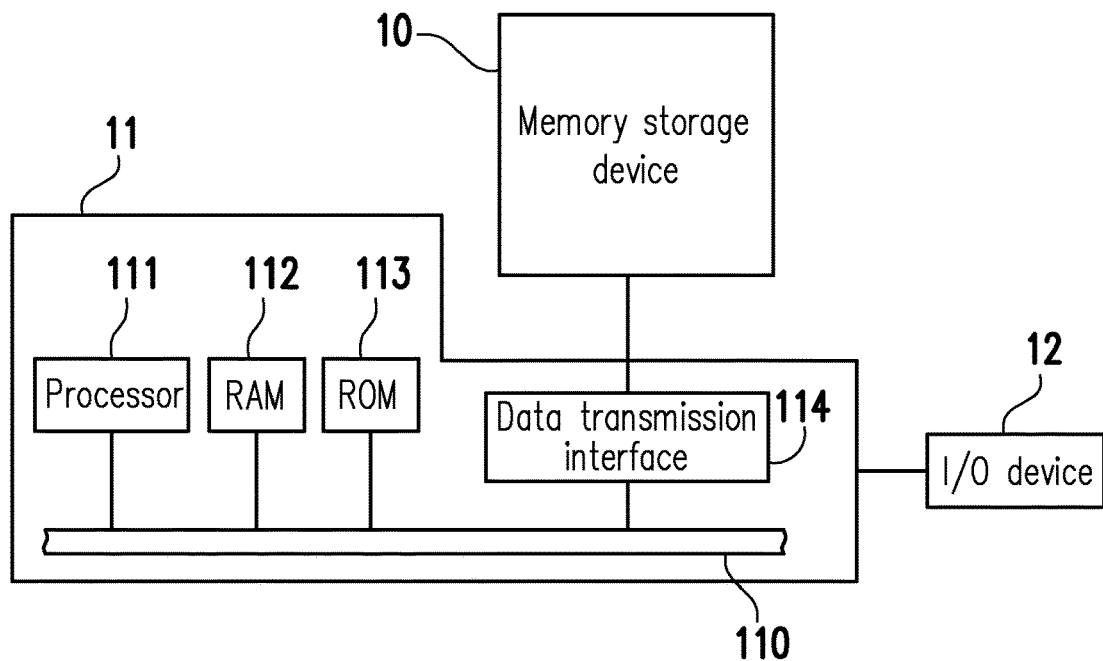
FIG. 1 is a schematic diagram of a host system, a memory storage device, and an input/output (I/O) device according to an exemplary embodiment of the disclosure.
Figure 2:
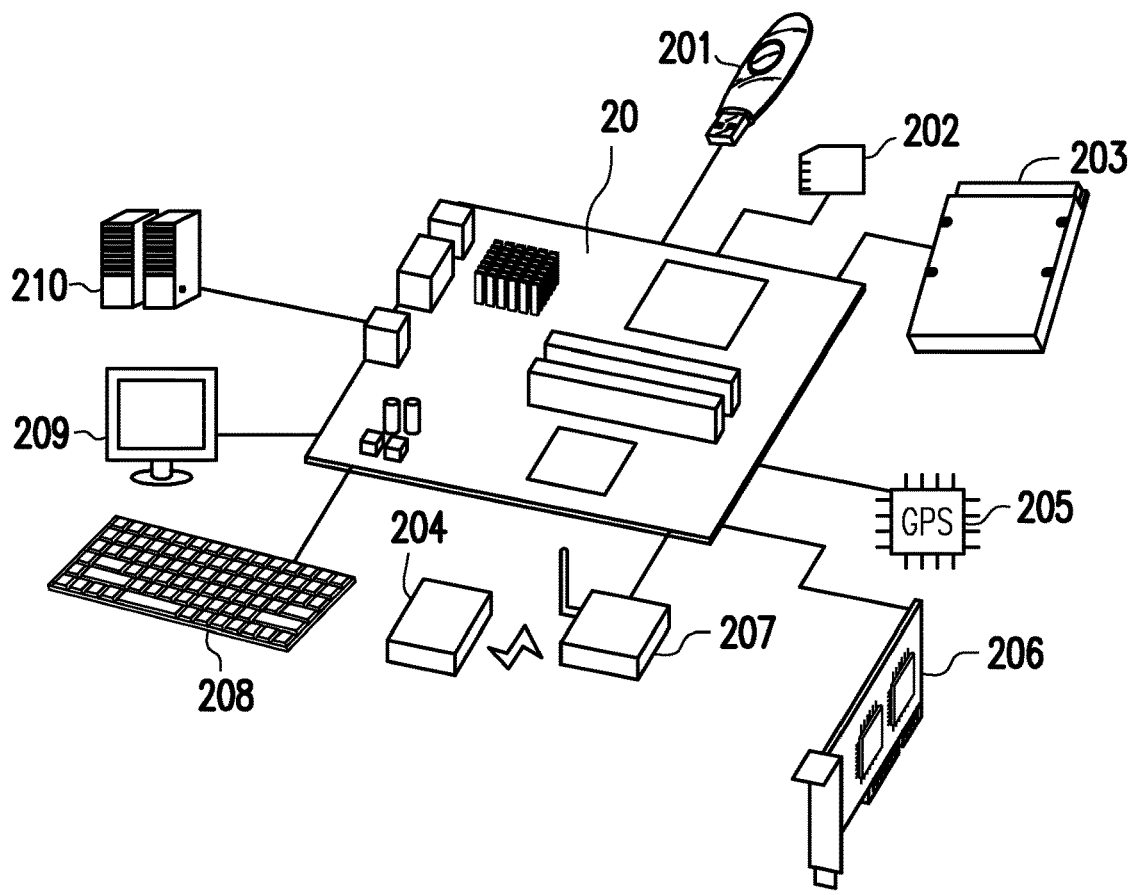
FIG. 2 is a schematic diagram of a host system, a memory storage device, and an I/O device according to an exemplary embodiment of the disclosure.

FIG. 1 is a schematic diagram of a host system, a memory storage device, and an input/output (I/O) device according to an exemplary embodiment of the disclosure. FIG. 2 is a schematic diagram of a host system, a memory storage device, and an I/O device according to an exemplary embodiment of the disclosure.

Referring to FIG. 1 and FIG. 2, a host system 11 may include a processor 111, a random access memory (RAM) 112, a read only memory (ROM) 113, and a data transmission interface 114. The processor 111, the random access memory 112, the read only memory 113, and the data transmission interface 114 may be coupled to a system bus 110.

In an exemplary embodiment, the host system 11 may be coupled to a memory storage device 10 through the data transmission interface 114. For example, the host system 11 may store data to or read data from the memory storage device 10 via the data transmission interface 114. In addition, the host system 11 may be coupled to an I/O device 12 through the system bus 110. For example, the host system 11 may transmit output signals to or receive input signals from the I/O device 12 via the system bus 110.

In an exemplary embodiment, the processor 111, the random access memory 112, the read only memory 113, and the data transmission interface 114 may be disposed on a motherboard 20 of the host system 11. The number of the data transmission interface 114 may be one or more. The motherboard 20 may be coupled to the memory storage device 10 through the data transmission interface 114 via a wired or wireless connection.

In an exemplary embodiment, the memory storage device 10 may be, for example, a flash drive 201, a memory card 202, a solid state drive (SSD) 203, or a wireless memory storage device 204. The wireless memory storage device 204 may be a memory storage device based on various wireless communication technologies, such as a near field communication (NFC) memory storage device, a wireless fax (WiFi) memory storage device, a Bluetooth memory storage device, a low power Bluetooth memory storage device (e.g. iBeacon), etc. In addition, the motherboard 20 may also be coupled to various I/O devices, such as a global positioning system (GPS) module 205, a network interface card 206, a wireless transmission device 207, a keyboard 208, a screen 209, a speaker 210, etc., through the system bus 110. For example, in an exemplary embodiment, the motherboard 20 may access the wireless memory storage device 204 through the wireless transmission device 207.

In an exemplary embodiment, the host system 11 is a computer system. In an exemplary embodiment, the host system 11 may be any system that may substantially cooperate with a memory storage device to store data. In an exemplary embodiment, the memory storage device 10 and the host system 11 may respectively include the memory storage device 30 and the host system 31 of FIG. 3

Figure 3:
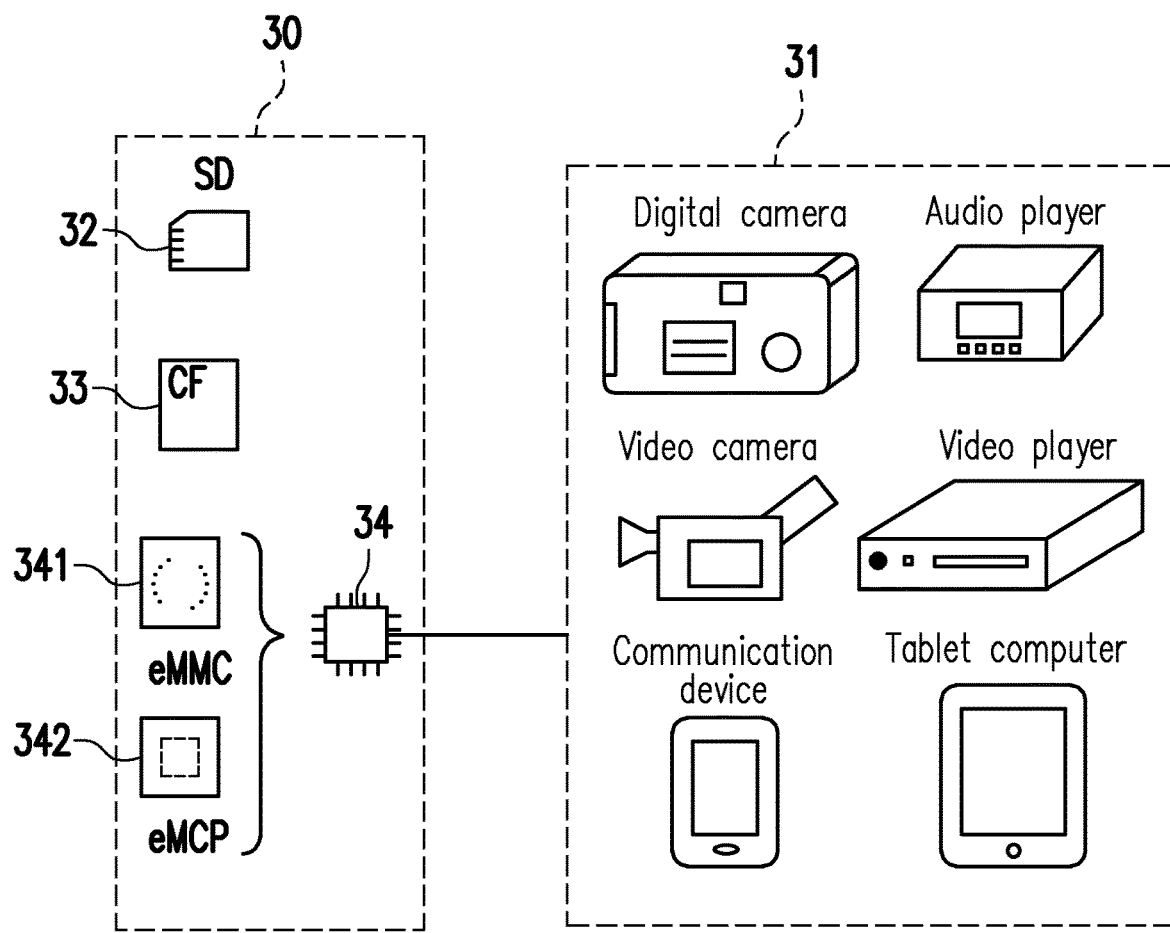
FIG. 3 is a schematic diagram of a host system and a memory storage device according to an exemplary embodiment of the disclosure.

FIG. 3 is a schematic diagram of a host system and a memory storage device according to an exemplary embodiment of the disclosure. Referring to FIG. 3, the memory storage device may be used in conjunction with the host system 31 to store data. For example, the host system 31 may be a digital camera, a video camera, a communication device, an audio player, a video player, or a tablet computer system. For example, the memory storage device 30 may be various non-volatile memory storage devices, such as a secure digital (SD) card 32, a compact flash (CF) card 33, or an embedded storage device 34, etc., used in the host system 31. The embedded storage device 34 includes various embedded storage devices that directly couple a memory module to a substrate of the host system, such as an embedded multimedia card (eMMC) 341 and/or an embedded multi-chip package (eMCP) storage device 342, etc.

Figure 4:
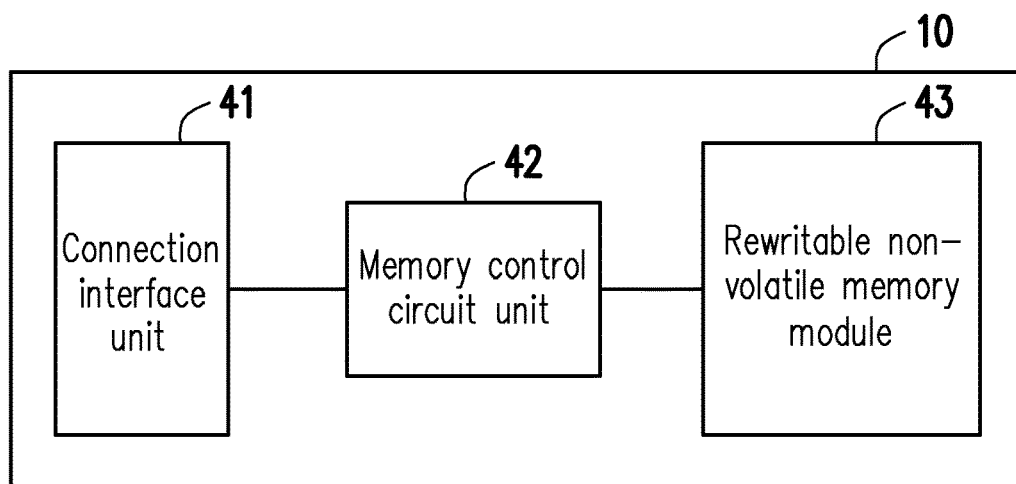
FIG. 4 is a schematic diagram of a memory storage device according to an exemplary embodiment of the disclosure.

FIG. 4 is a schematic diagram of a memory storage device according to an exemplary embodiment of the disclosure. Referring to FIG. 4, the memory storage device 10 includes a connection interface unit 41, a memory control circuit unit 42, and a rewritable non-volatile memory module 43.

The connection interface unit 41 is configured to couple the memory storage device 10 to the host system 11. The memory storage device 10 may communicate with the host system 11 via the connection interface unit 41. In an exemplary embodiment, the connection interface unit 41 is compatible with the peripheral component interconnect express (PCI Express) standard. In an exemplary embodiment, the connection interface unit 41 may also be compliant to the serial advanced technology attachment (SATA) standard, the parallel advanced technology attachment (PATA) standard, the institute of electrical and electronics engineers (IEEE) 1394 standard, the universal serial bus (USB) standard, the SD interface standard, the ultra high speed-I (UHS-I) interface standard, the ultra high speed-II (UHS-II) interface standard, the memory stick (MS) interface standard, the MCP interface standard, the MMC interface standard, the eMMC interface standard, the universal flash storage (UFS) interface standard, the eMCP interface standard, the CF interface standard, the integrated device electronics (IDE) standard, or other suitable standards. The connection interface unit 41 may be packaged in a chip with the memory control circuit unit 42, or the connection interface unit 41 may be disposed outside a chip including the memory control circuit unit 42.

The memory control circuit unit 42 is coupled to the connection interface unit 41 and the rewritable non-volatile memory module 43. The memory control circuit unit 42 is configured to execute multiple logic gates or control commands implemented in a hardware form or a firmware form and to perform operations such as writing, reading and erasing data in the rewritable non-volatile memory module 43 according to the commands of the host system 11.

The rewritable non-volatile memory module 43 is configured to store the data written by the host system 11. The rewritable non-volatile memory module 43 may include a single level cell (SLC) NAND-type flash memory module (i.e., a flash memory that may store 1 bit in one memory cell), multi-level cell (MLC) NAND-type flash memory module (i.e., a flash memory module that may store 2 bits in one memory cell), a triple level cell (TLC) NAND-type flash memory module (i.e., a flash memory module that may store 3 bits in one memory cell), a quad level cell (QLC) NAND-type flash memory module (i.e., a flash memory module that may store 4 bits in one memory cell), other flash memory modules, or other memory modules with the same characteristics.

Each of the memory cells in the rewritable non-volatile memory module 43 stores one or more bits by a change in a voltage (also referred to as a threshold voltage hereinafter). Specifically, there is a charge trapping layer between a control gate and a channel of each of the memory cells. By applying a write voltage to the control gate, the amount of electrons in the charge trapping layer may be changed, thereby changing the threshold voltage of the memory cell. This operation of changing the threshold voltage of the memory cell is also referred to as "writing data to the memory cell" or "programming the memory cell". As the threshold voltage changes, each of the memory cells in the rewritable non-volatile memory module 43 has multiple storage statuses. By applying a read voltage, it may be determined which storage status a memory cell belongs to, thereby obtaining the one or more bits stored in the memory cell.

In an exemplary embodiment, the memory cells of the rewritable non-volatile memory module 43 may constitute multiple physical programming units, and the physical programming units may constitute multiple physical erasing units. Specifically, memory cells on the same word line may form one or more physical programming units. If each of the memory cells may store two or more bits, the physical programming units on the same word line may be classified at least as lower physical programming units and upper physical programming units. For example, the least significant bit (LSB) of a memory cell belongs to a lower physical programming unit, and the most significant bit (MSB) of a memory cell belongs to an upper physical programming unit. Generally, in an MLC NAND flash memory, the write speed of the lower physical programming unit is greater than the write speed of the upper physical programming unit, and/or the reliability of the lower physical programming unit is higher than the reliability of the upper physical programming unit.

In the present exemplary embodiment, the physical programming unit is the minimum unit for programming. That is, the physical programming unit is the minimum unit for the writing data. For example, the physical programming unit may be a physical page or a physical sector. If the physical programming unit is a physical page, then the physical programming unit may include a data bit area and a redundancy bit area. The data bit area includes multiple physical sectors is configured to store user data, and the redundant bit area is configured to store system data (e.g., management data such as error correction codes). In an exemplary embodiment, the data bit area includes 32 physical sectors, and the size of a physical sector is 512 bytes (B). However, in other exemplary embodiments, the data bit area may also include 8, 16, or a greater or lesser number of physical sectors, and the size of each of the physical sectors may also be larger or smaller. On the other hand, the physical erasing unit is the minimum unit for erasing. That is, each of the physical erasing units includes the smallest number of memory cells to be erased together. For example, the physical erasing unit is a physical block.

Figure 5:
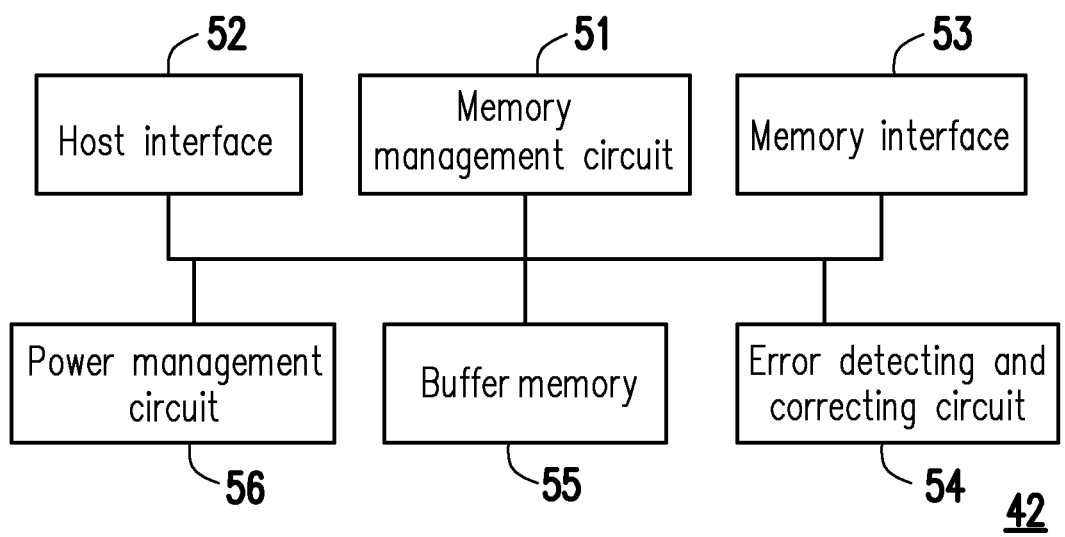
FIG. 5 is a schematic diagram of a memory control circuit unit according to an exemplary embodiment of the disclosure.

FIG. 5 is a schematic diagram of a memory control circuit unit according to an exemplary embodiment of the disclosure. Referring to FIG. 5, the memory control circuit unit 42 includes a memory management circuit 51, a host interface 52, a memory interface 53, and an error detecting and correcting circuit 54.

The memory management circuit 51 is configured to control the overall operation of the memory control circuit unit 42. Specifically, the memory management circuit 51 has multiple control commands, and when the memory storage device 10 operates, the control commands are executed to perform operations such as writing, reading, and erasing data. The following description of the operation of the memory management circuit 51 is equivalent to the description of the operation of the memory control circuit unit 42.

In an exemplary embodiment, the control commands of the memory management circuit 51 are implemented in a firmware form. For example, the memory management circuit 51 has a microprocessor unit (not shown) and a read only memory (not shown), and the control commands are programmed into the read only memory. When the memory storage device 10 operates, the control commands are executed by the microprocessor unit to perform operations such as writing, reading and erasing data.

In an exemplary embodiment, the control commands of the memory management circuit 51 may also be stored in a specific area of the rewritable non-volatile memory module 43 (e.g., a system area dedicated to storing system data in the memory module) in a program code form. In addition, the memory management circuit 51 has a microprocessor unit (not shown), a read-only memory (not shown) and a random access memory (not shown). In particular, the read only memory has a boot code, and when the memory control circuit unit 42 is enabled, the microprocessor unit first executes the boot code to load the control commands stored in the rewritable non-volatile memory module 43 into the random access memory of the memory management circuit 51. Thereafter, the microprocessor unit runs these control commands to perform operations such as writing, reading, and erasing data.

In an exemplary embodiment, the control commands of the memory management circuit 51 may also be implemented in a hardware form. For example, the memory management circuit 51 includes a microcontroller, a memory cell management circuit, a memory writing circuit, a memory reading circuit, a memory erasing circuit, and a data processing circuit. The memory cell management circuit, the memory writing circuit, the memory reading circuit, the memory erasing circuit and the data processing circuit are coupled to the microcontroller. The memory cell management circuit is configured to manage the memory cells or a memory cell group of the rewritable non-volatile memory module 43. The memory writing circuit is configured to issue a write command sequence to the rewritable non-volatile memory module 43 to write data into the rewritable non-volatile memory module 43. The memory reading circuit is configured to issue a read command sequence to the rewritable non-volatile memory module 43 to read data from the rewritable non-volatile memory module 43. The memory erasing circuit is configured to issue an erase command sequence to the rewritable non-volatile memory module 43 to erase data from the rewritable non-volatile memory module 43. The data processing circuit is configured to process the data to be written into the rewritable non-volatile memory module 43 and the data read from the rewritable non-volatile memory module 43. The write command sequence, the read command sequence and the erase command sequence may respectively include one or more program codes or command codes configured to instruct the rewritable non-volatile memory module 43 to perform corresponding writing, reading, and erasing operations. In an exemplary embodiment, the memory management circuit 51 may also issue other types of command sequences to the rewritable non-volatile memory module 43 to instruct the rewritable non-volatile memory module 43 to perform corresponding operations.

The host interface 52 is coupled to the memory management circuit 51. The memory management circuit 51 may communicate with the host system 11 through the host interface 52. The host interface 52 may be configured to receive and identify the commands and data transmitted by the host system 11. For example, the commands and data transmitted by the host system 11 may be transmitted to the memory management circuit 51 through the host interface 52. In addition, the memory management circuit 51 may transmit data to the host system 11 through the host interface 52. In this exemplary embodiment, the host interface 52 is compatible with the PCI Express standard. However, it should be understood that the disclosure is not limited thereto, and the host interface 52 may also be compatible with the SATA standard, the PATA standard, the IEEE 1394 standard, the USB standard, the SD standard, the UHS-I standard, the UHS-II standard, the MS standard, the MMC standard, the eMMC standard, the UFS standard, the CF standard, the IDE standard, or other suitable data transmission standards.

The memory interface 53 is coupled to the memory management circuit 51 and is configured to access the rewritable non-volatile memory module 43. For example, the memory management circuit 51 may access the rewritable non-volatile memory module 43 through the memory interface 53. In other words, the data to be written into the rewritable non-volatile memory module 43 is converted into a format acceptable to the rewritable non-volatile memory module 43 via the memory interface 53. Specifically, if the memory management circuit 51 is to access the rewritable non-volatile memory module 43, the memory interface 53 transmits a corresponding command sequence. For example, the command sequences may include a write command sequence to instruct data writing, a read command sequence to instruct data reading, an erase command sequence to instruct data erasing, and corresponding command sequences configured to instruct various memory operations (e.g., changing the read voltage level, executing a garbage collection operation, etc.). These command sequences are, for example, generated by the memory management circuit 51 and transmitted to the rewritable non-volatile memory module 43 via the memory interface 53. These command sequences may include one or more signals or data on the bus. The signals or data may include command codes or program codes. For example, the read command sequence includes information such as the read identification code, the memory address, etc.

The error detecting and correcting circuit (also referred to as a decoding circuit) 54 is coupled to the memory management circuit 51 and is configured to execute an error checking and correcting operation to ensure the correctness of the data. Specifically, when the memory management circuit 51 receives a write command from the host system 11, the error detecting and correcting circuit 54 generates a corresponding error correcting code (ECC) and/or error detecting code (EDC) for the data corresponding to the write command, and the memory management circuit 51 writes the data corresponding to the write command and the corresponding error correcting code and/or error checking code to the rewritable non-volatile memory module 43. Thereafter, when the memory management circuit 51 reads data from the rewritable non-volatile memory module 43, it simultaneously reads the error correcting code and/or the error detecting code corresponding to the data, and the error detecting and correcting circuit 54 executes the error detecting and correcting operation on the reading data according to the error correcting code and/or error detecting code.

In an exemplary embodiment, the memory control circuit unit 42 further includes a buffer memory 55 and a power management circuit 56.

The buffer memory 55 is coupled to the memory management circuit 51 and configured to temporarily store data. The power management circuit 56 is coupled to the memory management circuit 51 and configured to control the power of the memory storage device 10.

In an exemplary embodiment, the rewritable non-volatile memory module 43 of FIG. 4 may include a flash memory module. In an exemplary embodiment, the memory control circuit unit 42 of FIG. 4 may include a flash memory controller. In an exemplary embodiment, the memory management circuit 51 of FIG. 5 may include a flash memory management circuit.

Figure 6:
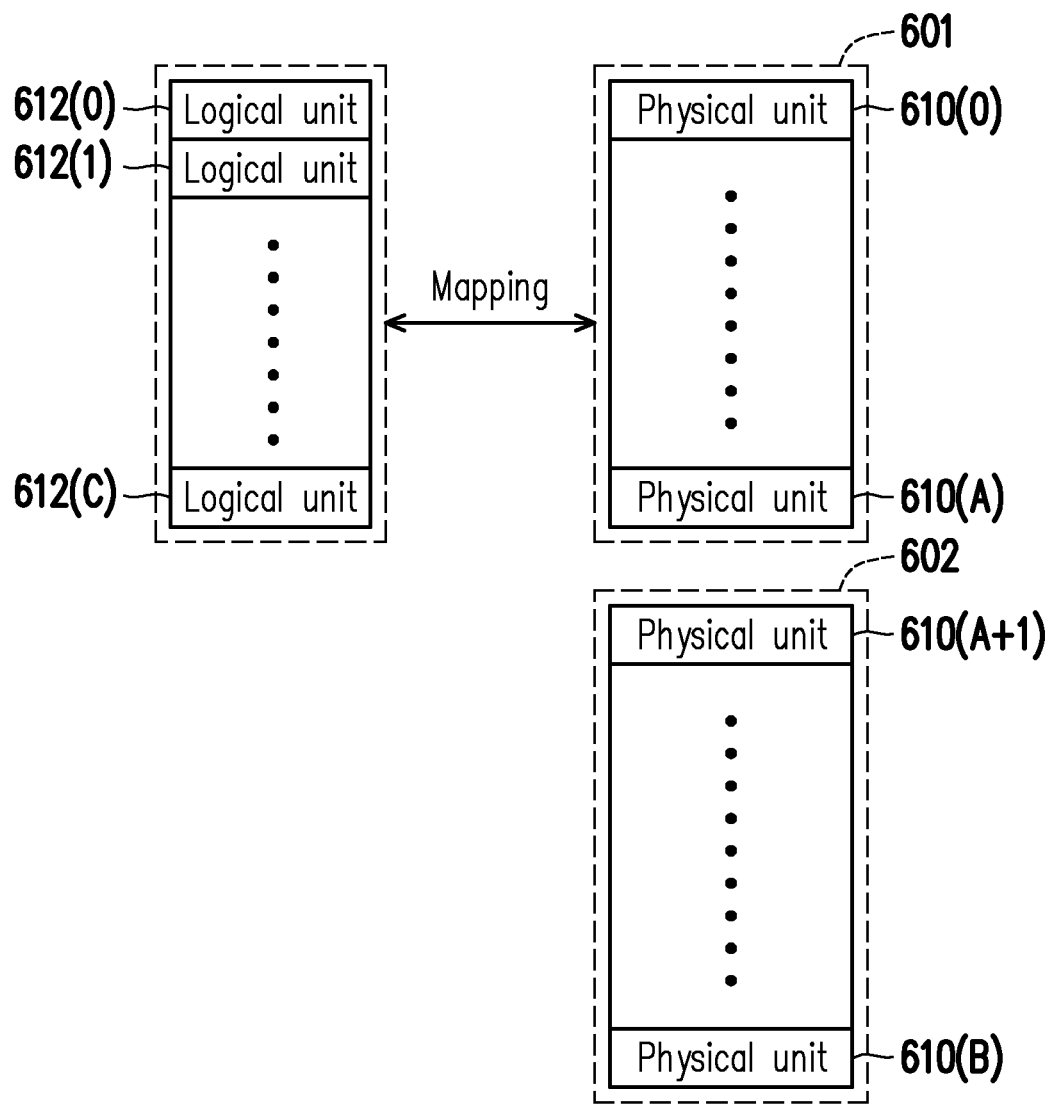
FIG. 6 is a schematic diagram of managing a rewritable non-volatile memory module according to an exemplary embodiment of the disclosure.

FIG. 6 is a schematic diagram of managing a rewritable non-volatile memory module according to an exemplary embodiment of the disclosure. Referring to FIG. 6, the memory management circuit 51 may logically group the physical units 610(0) to 610(B) in the rewritable non-volatile memory module 43 into a storage area 601 and a spare area 602.

In an exemplary embodiment, a physical unit refers to a physical address or a physical programming unit. In an exemplary embodiment, a physical unit may also be formed by multiple consecutive or non-consecutive physical addresses. In an exemplary embodiment, a physical unit may also refer to a virtual block (VB). A virtual block may include multiple physical addresses or multiple physical programming units.

The physical units 610(0) to 610(A) in the storage area 601 are configured to store user data (e.g., user data from the host system 11 of FIG. 1). For example, the physical units 610(0) to 610(A) in the storage area 601 may store valid data and invalid data. The physical units 610(A+1) to 610(B) in the spare area 602 do not store data (e.g., valid data). For example, if a certain physical unit does not store valid data, this physical unit may be associated (or added) to the spare area 602. In addition, the physical units in the spare area 602 (or the physical units not storing valid data) may be erased. When new data is written, one or more physical units may be extracted from the spare area 602 to store the new data. In an exemplary embodiment, the spare area 602 is also referred to as a free pool.

The logical units 612(0) to 612(C) may be configured in the memory management circuit 51 to map the physical units 610(0) to 610(A) in the storage area 601. In an exemplary embodiment, each of the logical units corresponds to a logical address. For example, a logical address may include one or more logical block addresses (LBA) or other logical management units. In an exemplary embodiment, a logical unit may also correspond to a logical programming unit or be formed by multiple consecutive or non-consecutive logical addresses.

It should be noted that a logical unit may be mapped to one or more physical units. If a certain physical unit is currently mapped by a certain logical unit, it means that the data currently stored in this physical unit includes valid data. On the contrary, if a certain physical unit is not currently mapped by any logical unit, it means that the data currently stored in this physical unit is invalid data.

The memory management circuit 51 may record the management data (also referred to as the logical to physical mapping information) describing the mapping relationship between logical units and physical units in at least one logical to physical mapping table. When the host system 11 reads data from the memory storage device 10 or writes data to the memory storage device 10, the memory management circuit 51 may access the rewritable non-volatile memory module 43 according to the information in the logical to physical mapping table.

Figure 7:
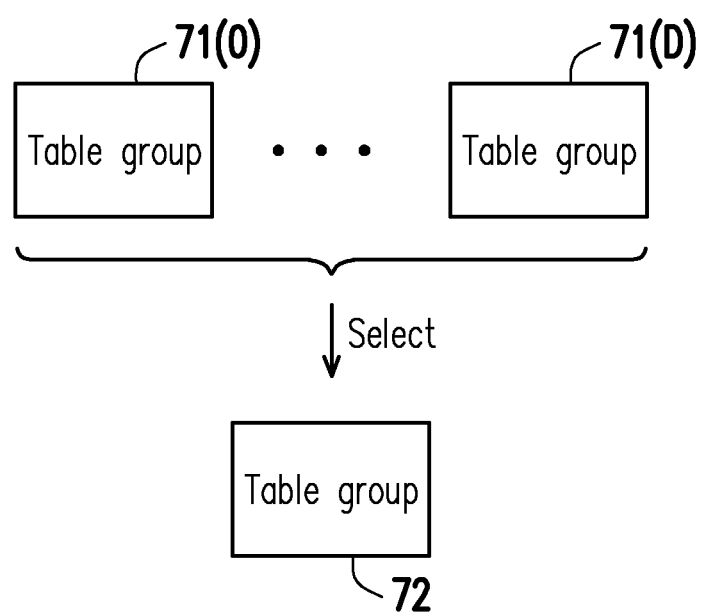
FIG. 7 is a schematic diagram of multiple table groups according to an exemplary embodiment of the disclosure.

FIG. 7 is a schematic diagram of multiple table groups according to an exemplary embodiment of the disclosure. Referring to FIG. 7, the memory management circuit 51 may store multiple table groups 71(0) to 71(D) in the rewritable non-volatile memory module 43 (e.g., storing in a system area dedicated to storing system information). Each of the table groups 71(0) to 71(D) may include multiple management tables (also referred to as voltage management tables). The information in the voltage management table may be configured to determine the read voltage level. For example, the voltage management table may record the voltage offset value. The voltage offset value may be configured to adjust the reference voltage level to obtain the read voltage level to be used. The determined read voltage level may be configured to read data from a specific physical unit (also referred to as the first physical unit) in the rewritable non-volatile memory module 43. In particular, different table groups may include different voltage management tables, so that the read voltage levels determined according to the voltage management tables in different table groups may also be different.

In an exemplary embodiment, the memory management circuit 51 may detect the status of the memory storage device 10. The memory management circuit 51 may determine one of the table groups 71(0) to 71(D) as a target table group 72 according to the status of the memory storage device 10. For example, the memory management circuit 51 may select one of the table groups 71(0) to 71(D) as the target table group 72 according to the status of the memory storage device 10. The voltage management tables in the target table group 72 are also referred to as target voltage management tables. Then, the memory management circuit 51 may use at least one read voltage level according to at least one of the target voltage management tables from the rewritable non-volatile memory module 43 (i.e., the first physical unit) to read data.

In an exemplary embodiment, the error detecting and correcting circuit 54 may perform a decoding operation on the data read from the first physical unit to attempt to correct erroneous bits in the data. For example, the error detecting and correcting circuit 54 may support various encoding/decoding algorithms such as low density parity check code (LDPC code) or BCH, etc. If a certain decoding operation may successfully decode certain data, the successfully decoded data may be output, for example, be transmitted to the host system 10 in response to the read request of the host system 10. However, if a certain decoding operation fails to successfully decode certain data, the memory management circuit 51 may use a different read voltage level according to the voltage management table (i.e., the target voltage management table) in the target table group 72 to read the first physical unit again to try to reduce the total number of erroneous bits in the reading data and/or improve the decoding success rate of the reading data. Thereafter, the error detecting and correcting circuit 54 may decode the reading data again.

Figure 8:
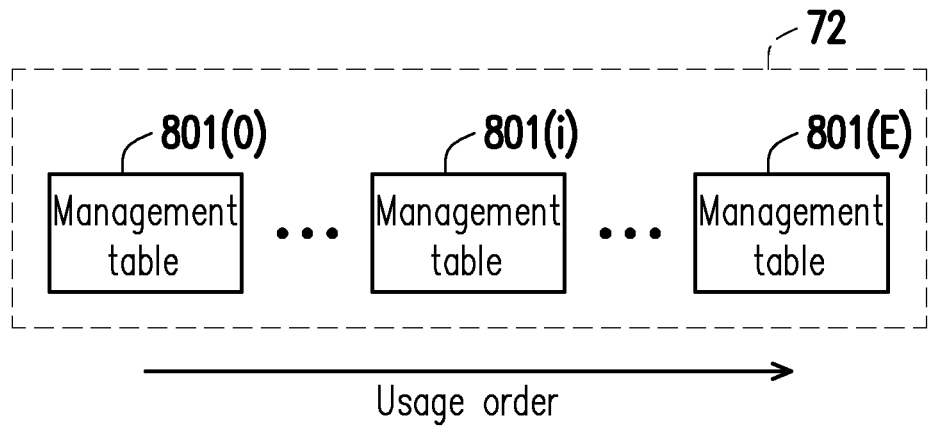
FIG. 8 is a schematic diagram of a management table and a usage order thereof according to an exemplary embodiment of the disclosure.
Figure 9:
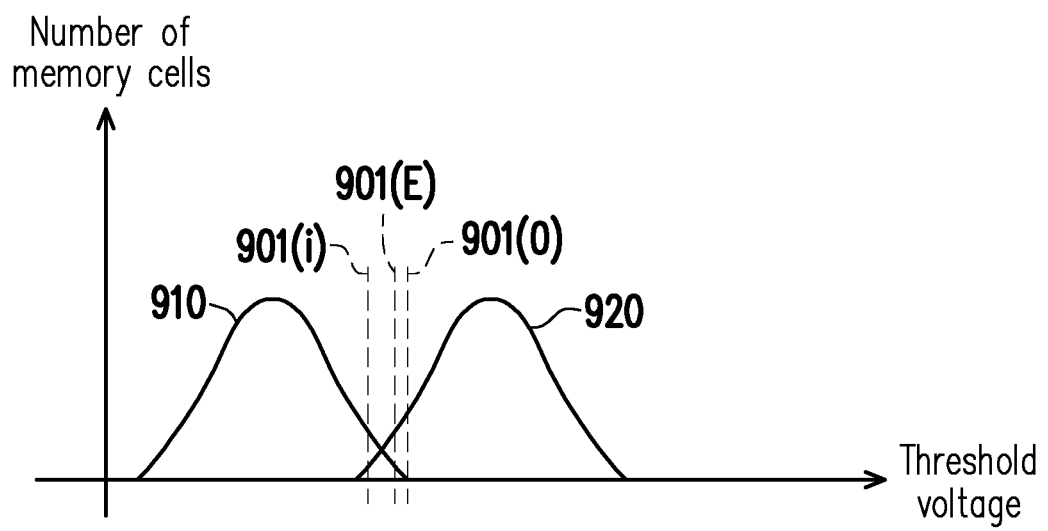
FIG. 9 is a schematic diagram of using different read voltage levels in order to read data in a decoding operation according to an exemplary embodiment of the disclosure.

FIG. 8 is a schematic diagram of a management table and a usage order thereof according to an exemplary embodiment of the disclosure. FIG. 9 is a schematic diagram of using different read voltage levels in order to read data in a decoding operation according to an exemplary embodiment of the disclosure.

Referring to FIG. 8, it is assumed that the target table group 72 includes management tables 801(0) to 801(E) (i.e., target voltage management tables). The information in the management tables 801(0) to 801(E) may be respectively configured to determine the read voltage levels 901(0) to 901(E) in FIG. 9. For example, information in the management table 801(0) may be configured to determine read voltage level 901(0), information in the management table 801(i) may be configured to determine read voltage level 901(i), and information in the management table 801(E) may be configured to determine the read voltage level 901(E), in which "i" may be a positive integer greater than 0 and less than E.

It should be noted that, in the decoding operation for the data read from the same physical unit using the target table group 72, the usage order of the management tables 801(0) to 801(E) is as shown in FIG. 8. For example, this usage order may reflect that the management table 801(0) has a higher usage priority than the management table 801(i), and the management table 801(i) has a higher usage priority than the management table 801(E). In addition, the usage order of the management tables 801(0) to 801(E) may be dynamically adjusted according to specific rules.

Referring to FIG. 9, it is assumed that the usage order of the management tables 801(0) to 801(E) in FIG. 8 reflects that the management table 801(0) has the highest usage priority. When data is to be read from the first physical unit, the memory management circuit 51 may first determine the read voltage level 901(0) according to the information in the management table 801(0). Then, the memory management circuit 51 may send the read command sequence to the rewritable non-volatile memory module 43 according to the read voltage level 901(0). The read command sequence may instruct the rewritable non-volatile memory module 43 to use the read voltage level 901(0) to read the data in the first physical unit.

In an exemplary embodiment, it is assumed that the threshold voltage distributions of multiple memory cells in the first physical unit include the status 910 and the status 920. A memory cell belonging to the status 910 is configured to store a certain bit (or a combination of bits). A memory cell belonging to the status 920 is configured to store another bit (or another combination of bits). For example, a memory cell belonging to the status 910 may be configured to store bit "1" (or a bit combination "111"), and/or a memory cell belonging to the status 920 may be configured to store bit "0" (or a bit combination "000"), etc., the disclosure is not limited thereto.

According to the received read command sequence, the rewritable non-volatile memory module 43 may apply the read voltage level 901(0) to the memory cells in the first physical unit. If a certain memory cell may be turned on by the read voltage level 901(0) (e.g., the threshold voltage of the memory cell is lower than the read voltage level 901(0)), the memory management circuit 51 may determine that the memory cell belongs to the status 810. Conversely, if a certain memory cell is not turned on by the read voltage level 801(0) (e.g., the threshold voltage of the memory cell is greater than the read voltage level 901(0)), the memory management circuit 51 may determine the memory cell Belongs to status 920. Thereby, the memory management circuit 51 may obtain the data read from the first physical unit using the read voltage level 901(0). For example, this data may reflect the conduction status of the read voltage level 901(0) to the memory cells in the first physical unit. Then, the error detecting and correcting circuit 54 may decode this data. If the data may be successfully decoded, the error detecting and correcting circuit 54 may output the successfully decoded data.

However, if the data read using the read voltage level 901(0) cannot be successfully decoded, the memory management circuit 51 may read the information in the management table 801(i) according to the usage order of the management tables 801(0) to 801(E). The memory management circuit 51 may determine the next read voltage level, i.e., the read voltage level 901(i), according to the information in the management table 801(i). Then, the memory management circuit 51 may send a read command sequence to the rewritable non-volatile memory module 43 according to the read voltage level 901(i). The read command sequence may instruct the rewritable non-volatile memory module 43 to use the read voltage level 901(i) to read the data in the first physical unit. According to the read command sequence, the rewritable non-volatile memory module 43 may apply the read voltage level 901(i) to the memory cells in the first physical unit. Thereby, the memory management circuit 51 may obtain the data read from the first physical unit using the read voltage level 901(i). This data may reflect the conduction status of the read voltage level 901(i) to the memory cells in the first physical unit. Then, the error detecting and correcting circuit 54 may decode this data. If the data may be successfully decoded, the error detecting and correcting circuit 54 may output the successfully decoded data.

By analogy, if the data read using the read voltage level 901(i) cannot be successfully decoded, the memory management circuit 51 may read the information in the management table 801(E) according to the usage order of the management tables 801(0) to 801(E). The memory management circuit 51 may determine the next read voltage level, i.e., the read voltage level 901(E), according to the information in the management table 801(E). Then, the memory management circuit 51 may send the read command sequence to the rewritable non-volatile memory module 43 according to the read voltage level 901(E). The read command sequence may instruct the rewritable non-volatile memory module 43 to use the read voltage level 901(E) to read the data in the first physical unit. According to the read command sequence, the rewritable non-volatile memory module 43 may apply the read voltage level 901(E) to the memory cells in the first physical unit. Thereby, the memory management circuit 51 may obtain the data read from the first physical unit using the read voltage level 901(E). This data may reflect the conduction status of the read voltage level 901(E) to the memory cells in the first physical unit. Then, the error detecting and correcting circuit 54 may decode this data.

In an exemplary embodiment, the repeatable decoding operation in the exemplary embodiment of FIG. 9 is also referred to as a hard decoding operation. This hard decoding operation may be configured to repeatedly decode data read from the first physical unit using different read voltage levels until the management tables 801(0) to 801(E) in the target table group 72 are all used or until the reading data is successfully decoded. It should be noted that the respective voltage levels of the read voltage levels 901(0) to 901(E), the total number of the read voltage levels 901(0) to 901(E), and the types of the status 910 and the status 920 are all examples and are not intended to limit the disclosure.

In an exemplary embodiment, according to different statuses of the memory storage device 10, the memory management circuit 51 may determine different table groups in the table groups 71(0) to 71(D) as the target table group 72. For example, in a specific status (also referred to as a first status) of the memory storage device 10, the memory management circuit 51 may determine a specific table group (also referred to as a first table group) in the table groups 71(0) to 71(D) as the target table group 72. In addition, in another status (also referred to as the second status) of the memory storage device 10, the memory management circuit 51 may determine another table group (also referred to as a second table group) in the table groups 71(0) to 71(D) as the target table group 72. The first table group is different from the second table group.

In an exemplary embodiment, in response to a change in the status of the memory storage device 10, the memory management circuit 51 may switch the target table group 72 from a specific table group (e.g., the first table group) in the table groups 71(0) to 71(D) to another table group (e.g., the second table group) in the table groups 71(0) to 71(D). For example, in response to the status of the memory storage device 10 changing from the first status to the second status, the memory management circuit 51 may switch the target table group 72 from the first table group to the second table group.

In an exemplary embodiment, the detected status information that may be configured to determine or change the target table group 72 includes at least one of a working status, a temperature status, a usage status, and a decoding status of the memory storage device 10. The memory management circuit 51 may determine one of the table groups 71(0) to 71(D) as the target table group 72 according to at least one of the working status, the temperature status, the usage status, and the decoding status of the memory storage device 10.

In an exemplary embodiment, the working status of the memory storage device 10 may reflect whether the memory storage device 10 is in the powering-on stage. For example, in the powering-on stage, the memory storage device 10 is performing a booting procedure. The memory storage device 10 may end the powering procedure and enter the normal operation stage after completing the booting procedure.

In an exemplary embodiment, in response to the memory storage device 10 being in the powering-on stage (e.g., the memory storage device 10 is executing a booting procedure), the memory management circuit 51 may determine the table group 71(f) in the table groups 71(0) to 71(D) as the target table group 72. Later, in response to the memory storage device 10 not being in the powering-on stage (e.g., the memory storage device 10 has finished the booting procedure), the memory management circuit 51 may instead determine the table group 71(g) as the target table group 72. The table group 71(f) is different from the table group 71(g).

In an exemplary embodiment, the temperature status of the memory storage device 10 may reflect the temperature of the rewritable non-volatile memory module 43 (or the memory storage device 10). In an exemplary embodiment, the temperature status of the memory storage device 10 may reflect whether the temperature of the rewritable non-volatile memory module 43 (or the memory storage device 10) is within a specific temperature range.

In an exemplary embodiment, in response to the temperature of the rewritable non-volatile memory module 43 (or the memory storage device 10) being within a specific temperature range (also referred to as the first temperature range), the memory management circuit 51 may determine the table group 71(h) in the table groups 71(0) to 71(D) as the target table group 72. In addition, in response to the temperature of the rewritable non-volatile memory module 43 (or the memory storage device 10) being within another temperature range (also referred to as a second temperature range), the memory management circuit 51 may determine the table group 71(j) in the table groups 71(0) to 71(D) as the target table group 72. The first temperature range is different from the second temperature range. The table group 71(h) is different from the table group 71(j).

In an exemplary embodiment, the usage status of the memory storage device 10 may reflect the wear level of the rewritable non-volatile memory module 43. For example, the wear level of the rewritable non-volatile memory module 43 may include the wear level of the first physical unit. For example, the wear level of the rewritable non-volatile memory module 43 may be positively related to the number of times the memory cells in the first physical unit are programmed, the number of times the memory cells in the first physical unit are erased, the number of times the memory cells in the first physical unit are read, and the bit error rate. For example, the number of times that the memory cells in the first physical unit are programmed, the number of times the memory cells in the first physical unit are erased, and the number of times the memory cells in the first physical unit are read may be respectively represented by a program count, an erase count, and a read count. In an exemplary embodiment, the memory management circuit 51 may obtain the wear level of the rewritable non-volatile memory module 43 according to the program count, the erase count, the read count, and/or the bit error rate.

In an exemplary embodiment, in response to the wear level of the rewritable non-volatile memory module 43 meeting a specific condition (also referred to as a first condition), such as the program count, the erase count, the read count, and/or the bit error rate is within a specific value range (also referred to as a first value range), the memory management circuit 51 may determine the table group 71(k) in the table groups 71(0) to 71(D) as the target table group 72. In addition, in response to the wear level of the rewritable non-volatile memory module 43 meeting another condition (also referred to as a second condition), such as the program count, the erase count, the read count, and/or the bit error rate is within another value range (also referred to as a second value range), the memory management circuit 51 may determine the table group 71(m) in the table groups 71(0) to 71(D) as the target table group 72. The first value range is different from the second value range. The table group 71(k) is different from the table group 71(m).

In an exemplary embodiment, the decoding status of the memory storage device 10 may reflect whether the memory storage device 10 is in a specific decoding stage. For example, the specific decoding stage may include a final (hard) decoding stage just before the error detecting and correcting circuit 54 enters a soft decoding operation.

In an exemplary embodiment, the error detecting and correcting circuit 54 may perform a soft decoding operation after determining that the hard decoding operation fails. In the soft decoding operation, the error detecting and correcting circuit 54 may use more read voltage levels to read the first physical unit to obtain more auxiliary information (also referred to as soft information) that may be configured to decode data. Based on the soft information, the decoding capability of the error detecting and correcting circuit 54 in the soft decoding operations may be higher than the decoding capability of the error detecting and correcting circuit 54 in the hard decoding operations.

In an exemplary embodiment, in response to the memory storage device 10 not being in the specific decoding stage, the memory management circuit 51 may determine the table group 71(p) in the table groups 71(0) to 71(D) as the target table group 72. However, in response to the memory storage device 10 being in the specific decoding phase, for example, the error detecting and correcting circuit 54 is operating in the final (hard) decoding phase just before entering the soft decoding operation, the memory management circuit 51 may determine the table group 71(q) in the table groups 71(0) to 71(D) as the target table group 72. The table group 71(p) is different from the table group 71(q).

In an exemplary embodiment, the memory management circuit 51 may adjust the table group (e.g., the table group 71(q)) dedicated to be used in the specific decoding stage according to the execution result of the soft decoding operation. For example, the memory management circuit 51 may adjust the information in one or more voltage management tables in the table group 71(q) according to the soft information obtained in the soft decoding operation. Thereafter, in the final (hard) decoding stage just before the error detecting and correcting circuit 54 enters the soft decoding operation, the read voltage level determined and used according to one or more voltage management tables in the table group 71(q) may be configured to read data with higher accuracy from the first physical unit. In addition, in an exemplary embodiment, the table group 71(q) may also be set as the target table group 72 in the soft decoding operation.

Figure 10:
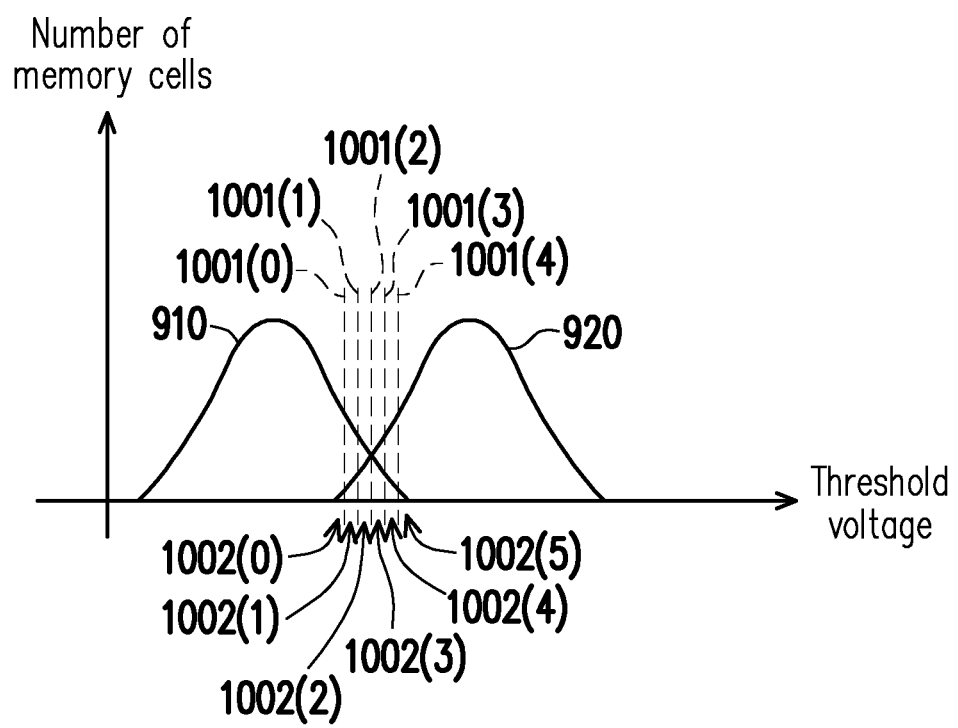
FIG. 10 is a schematic diagram of a soft decoding operation according to an exemplary embodiment of the disclosure.

FIG. 10 is a schematic diagram of a soft decoding operation according to an exemplary embodiment of the disclosure. Referring to FIG. 10, in the soft decoding operation, multiple read voltage levels (also referred to as soft read voltage levels) 1001(0) to 1001(4) may be configured to read the memory cells in the first physical unit. In particular, the read voltage levels 1001(0) to 1001(4) may be configured to divide the threshold voltage distribution of the memory cells in the first physical unit into multiple voltage areas 1002(0) to 1002(5), as shown in FIG. 10. For example, the voltage area 1002(1) is located between the read voltage levels 1001(0) and 1001(1), and so on. According to the reading result of the reading voltage levels 1001(0) to 1001(4) to a certain memory cell in the first physical unit, the memory management circuit 51 may obtain the soft information corresponding to the first physical unit. The soft information may reflect that the threshold voltage of each of the memory cells in the first physical unit is within a certain voltage area among the voltage areas 1002(0) to 1002(5). The memory management circuit 51 may adjust the information in one or more voltage management tables in the table group 71(q) according to the soft information. In addition, the reading results (that is, the soft information) of the read voltage levels 1001(0) to 1001(4) to the first physical unit may also be used in more ways, for example, to adjust the log likelihood ratio (LLR) corresponding to the first physical unit, etc., to improve the decoding success rate of the soft decoding operation, the disclosure is not limited thereto.

In an exemplary embodiment, one or more of the status information that may reflect the current status of the memory storage device 10 may be selected and used in combination, so that the most suitable table group is adopted corresponding to the current status of the memory storage device 10 as the target table group 72. For example, when the memory storage device is in the powering-on stage and the temperature of the rewritable non-volatile memory module 43 (or the memory storage device 10) is within the first temperature range, the memory management circuit 51 may determine the table group 71(r) in the table groups 71(0) to 71(D) as the target table group 72. Later, when the memory storage device 10 is not in the powering-on stage and the temperature of the rewritable non-volatile memory module 43 (or the memory storage device 10) is still within the first temperature range, the memory management circuit 51 may determine the table group 71(s) in the table groups 71(0) to 71(D) as the target table group 72. The table group 71(r) is different from the table group 71(s). More combinations of the statuses of the memory storage device 10 and the adopted target table group 72 may be paired and set according to practical requirements, the disclosure is not limited thereto.

Figure 11:
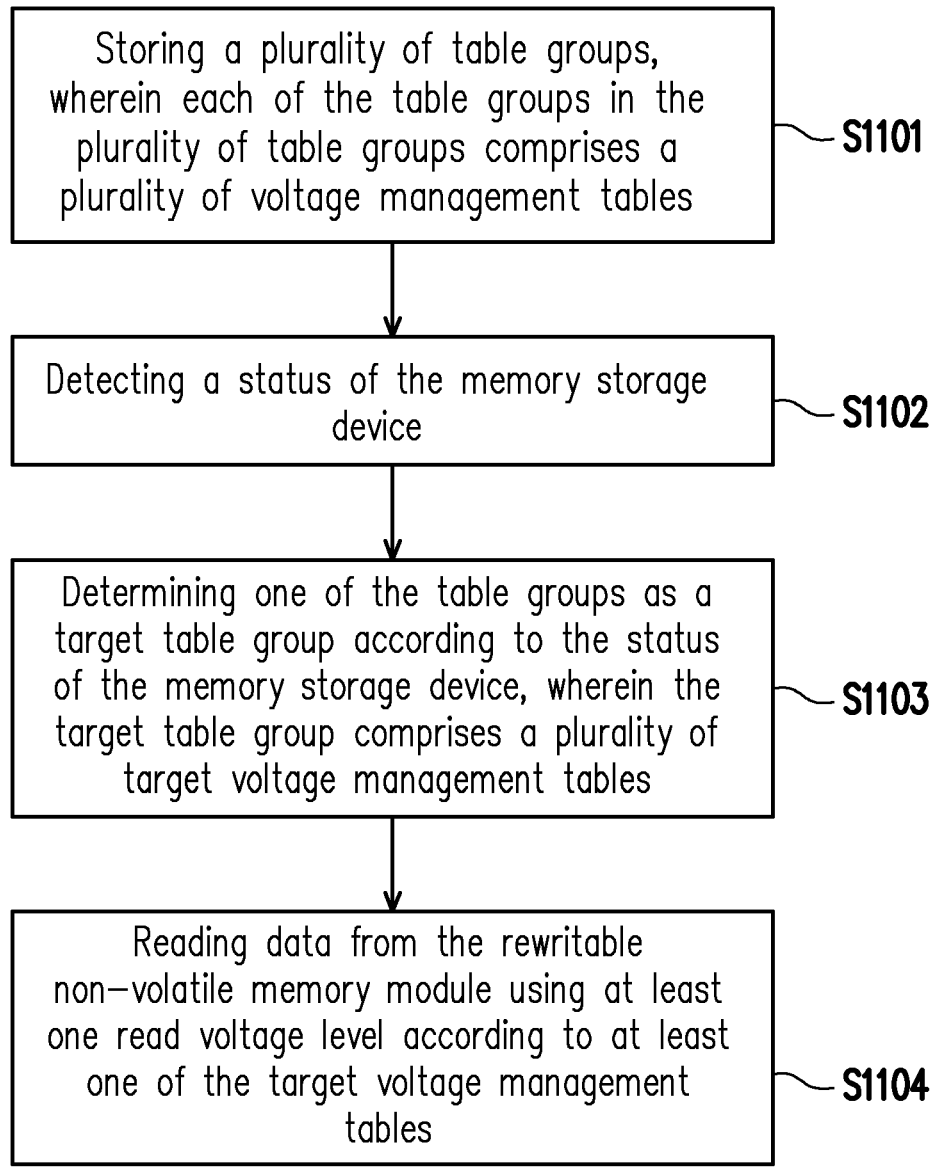
FIG. 11 is a flowchart of a table management method according to an exemplary embodiment of the disclosure.

FIG. 11 is a flowchart of a table management method according to an exemplary embodiment of the disclosure. Referring to FIG. 11, in step S1101, multiple table groups are stored, in which each of the table groups in the multiple table groups includes multiple voltage management tables. In step S1102, the status of the memory storage device is detected. In step S1103, one of the table groups is determined as a target table group according to the status of the memory storage device, in which the target table group includes multiple target voltage management tables. In step S1104, data is read from the rewritable non-volatile memory module using at least one read voltage level according to at least one of the target voltage management tables.

However, each of the steps in FIG. 11 has been described in detail as the above, and are not repeated herein. It should be noted that each of the steps in FIG. 11 may be implemented as multiple program codes or circuits, and the disclosure is not limited thereto. In addition, the method in FIG. 11 may be used in conjunction with the above-mentioned exemplary embodiments, or may be used alone, and the disclosure is not limited thereto.

To sum up, the exemplary embodiments of the disclosure may dynamically determine a specific table group as the target table group according to the current status of the memory storage device. Thereafter, the read voltage level determined and used according to one or more voltage management tables in the target table group may be configured to read data with a higher accuracy rate from the rewritable non-volatile memory module. Thereby, the data decoding efficiency of the memory storage device in different statuses may be effectively improved or maintained.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:

1. A table management method for a memory storage device, wherein the memory storage device comprises a rewritable non-volatile memory module, and the table management method comprises:
    storing a plurality of table groups, wherein each of the table groups in the plurality of table groups comprises a plurality of voltage management tables;
    detecting a status of the memory storage device, wherein the status comprises a working status of the memory storage device, and the working status reflects whether the memory storage device is performing a booting procedure;
    determining one of the table groups as a target table group according to the status of the memory storage device, wherein the target table group comprises a plurality of target voltage management tables; and
    reading data from the rewritable non-volatile memory module using at least one read voltage level according to at least one of the target voltage management tables.

2. The table management method according to claim 1, wherein a step that determines the one of the table groups as the target table group according to the status of the memory storage device comprises:
    switching the target table group from a first table group in the table groups to a second table group in the table groups in response to a change in the status of the memory storage device,
    wherein the first table group is different from the second table group.

3. The table management method according to claim 1, wherein a step that determines the one of the table groups as the target table group according to the status of the memory storage device comprises:
    determining a first table group in the table groups as the target table group in a first status of the memory storage device;
    determining a second table group in the table groups as the target table group in a second status of the memory storage device,
    wherein the first table group is different from the second table group.

4. The table management method according to claim 1, wherein a step that determines the one of the table groups as the target table group according to the status of the memory storage device comprises:
    determining the one of the table groups as the target table group according to at least one of the working status, a temperature status, a usage status, and a decoding status of the memory storage device.

5. The table management method according to claim 4, wherein the working status further reflects whether the memory storage device is in a powering-on stage.

6. The table management method according to claim 4, wherein the temperature status reflects whether a temperature of the rewritable non-volatile memory module is within a specific temperature range.

7. The table management method according to claim 4, wherein the usage status reflects a wear level of the rewritable non-volatile memory module.

8. The table management method according to claim 4, wherein the decoding status reflects whether the memory storage device is in a specific decoding stage.

9. A memory storage device, comprising:
    a connection interface unit, configured to be coupled to the host system;
    a rewritable non-volatile memory module; and a memory control circuit unit, coupled to the connection interface unit and the rewritable non-volatile memory module, wherein the memory control circuit unit is configured for:

storing a plurality of table groups, wherein each of the table groups in the plurality of table groups comprises a plurality of voltage management tables;

detecting a status of the memory storage device, wherein the status comprises a working status of the memory storage device, and the working status reflects whether the memory storage device is performing a booting procedure;

determining one of the table groups as a target table group according to the status of the memory storage device, wherein the target table group comprises a plurality of target voltage management tables; and reading data from the rewritable non-volatile memory module using at least one read voltage level according to at least one of the target voltage management tables.

10. The memory storage device according to claim 9, wherein an operation that determines the one of the table groups as the target table group according to the status of the memory storage device comprises:

switching the target table group from a first table group in the table groups to a second table group in the table groups in response to a change in the status of the memory storage device, wherein the first table group is different from the second table group.

11. The memory storage device according to claim 9, wherein an operation that determines the one of the table groups as the target table group according to the status of the memory storage device comprises:

determining a first table group in the table groups as the target table group in a first status of the memory storage device;

determining a second table group in the table groups as the target table group in a second status of the memory storage device, wherein the first table group is different from the second table group.

12. The memory storage device according to claim 9, wherein an operation that determines the one of the table groups as the target table group according to the status of the memory storage device comprises:

determining the one of the table groups as the target table group according to at least one of the working status, a temperature status, a usage status, and a decoding status of the memory storage device.

13. The memory storage device according to claim 12, wherein the working status further reflects whether the memory storage device is in a powering-on stage.

14. The memory storage device according to claim 12, wherein the temperature status reflects whether a temperature of the rewritable non-volatile memory module is within a specific temperature range.

15. The memory storage device according to claim 12, wherein the usage status reflects a wear level of the rewritable non-volatile memory module.

16. The memory storage device according to claim 12, wherein the decoding status reflects whether the memory storage device is in a specific decoding stage.

17. A memory control circuit unit, comprising:

a host interface, configured to be coupled to the host system;

a memory interface, configured to be coupled to a rewritable non-volatile memory module; and a memory management circuit, coupled to the host interface and the memory interface, wherein the memory management circuit is configured for:

storing a plurality of table groups, wherein each of the table groups in the plurality of table groups comprises a plurality of voltage management tables;

detecting a status of the memory control circuit unit, wherein the status comprises a working status of the memory storage device, and the working status reflects whether the memory storage device is performing a booting procedure;

determining one of the table groups as a target table group according to the status of the memory control circuit unit, wherein the target table group comprises a plurality of target voltage management tables; and reading data from the rewritable non-volatile memory module using at least one read voltage level according to at least one of the target voltage management tables.

18. The memory control circuit unit according to claim 17, wherein an operation that determines the one of the table groups as the target table group according to the status of the memory control circuit unit comprises:

switching the target table group from a first table group in the table groups to a second table group in the table groups in response to a change in the status of the memory control circuit unit, wherein the first table group is different from the second table group.

19. The memory control circuit unit according to claim 17, wherein an operation that determines the one of the table groups as the target table group according to the status of the memory control circuit unit comprises:

determining a first table group in the table groups as the target table group in a first status of the memory control circuit unit;

determining a second table group in the table groups as the target table group in a second status of the memory control circuit unit, wherein the first table group is different from the second table group.

20. The memory control circuit unit according to claim 17, wherein an operation that determines the one of the table groups as the target table group according to the status of the memory control circuit unit comprises:

determining the one of the table groups as the target table group according to at least one of the working status, a temperature status, a usage status, and a decoding status of the memory control circuit unit.

21. The memory control circuit unit according to claim 20, wherein the working status further reflects whether the memory control circuit unit is in a powering-on stage.

22. The memory control circuit unit according to claim 20, wherein the temperature status reflects whether a temperature of the rewritable non-volatile memory module is within a specific temperature range.

23. The memory control circuit unit according to claim 20, wherein the usage status reflects a wear level of the rewritable non-volatile memory module.

24. The memory control circuit unit according to claim 20, wherein the decoding status reflects whether the memory control circuit unit is in a specific decoding stage.

* * * * *